United States Patent
Kozhumam et al.

(10) Patent No.: US 8,773,086 B1
(45) Date of Patent: Jul. 8, 2014

(54) CIRCUITS AND METHODS FOR DYNAMIC VOLTAGE MANAGEMENT

(75) Inventors: Shankar R. Kozhumam, Austin, TX (US); Jon E. Tourville, Colorado Springs, CO (US)

(73) Assignee: Marvell International Ltd., Hamilton (BM)

( * ) Notice: Subject to any disclaimer, the term of this patent is extended or adjusted under 35 U.S.C. 154(b) by 552 days.

(21) Appl. No.: 12/327,465

(22) Filed: Dec. 3, 2008

Related U.S. Application Data

(60) Provisional application No. 61/012,212, filed on Dec. 7, 2007.

(51) Int. Cl.
*G05F 1/563* (2006.01)

(52) U.S. Cl.
USPC ............... 323/266; 323/299; 323/275

(58) Field of Classification Search
USPC .......... 323/265, 266, 282, 284, 299; 307/130, 307/141.4
See application file for complete search history.

(56) References Cited

U.S. PATENT DOCUMENTS

| | | | | |
|---|---|---|---|---|
| 5,280,233 | A * | 1/1994 | Poletto et al. | 323/269 |
| 6,169,392 | B1 * | 1/2001 | Kitagawa | 323/282 |
| 7,106,042 | B1 * | 9/2006 | Jackson | 323/316 |
| 2003/0137285 | A1 * | 7/2003 | Tamai et al. | 323/266 |
| 2004/0239301 | A1 * | 12/2004 | Kobayashi | 323/284 |
| 2005/0194839 | A1 * | 9/2005 | Amerom et al. | 307/82 |
| 2005/0242788 | A1 * | 11/2005 | Reithmaier | 323/222 |
| 2006/0006850 | A1 * | 1/2006 | Inoue et al. | 323/265 |
| 2006/0108993 | A1 * | 5/2006 | Chien et al. | 323/282 |
| 2007/0133236 | A1 * | 6/2007 | Usui | 363/56.01 |
| 2007/0223255 | A1 * | 9/2007 | Condemine et al. | 363/16 |
| 2007/0285069 | A1 * | 12/2007 | Schopfer et al. | 323/282 |
| 2008/0186004 | A1 * | 8/2008 | Williams | 323/282 |

* cited by examiner

*Primary Examiner* — Adolf Berhane
*Assistant Examiner* — Gustavo Rosario Benitez

(57) ABSTRACT

In one embodiment the present invention includes a circuit comprising a voltage adjust circuit and an input terminal of an electronic system. The voltage adjust circuit is coupled to receive an input voltage. The input terminal of the electronic system is coupled to receive a supply voltage from an output terminal of the voltage adjust circuit. The voltage adjust circuit makes an adjustment to the supply voltage based on a minimum voltage requirement of the electronic system. Accordingly, the leakage current supplied to the electronic system reduces, thereby saving power.

20 Claims, 5 Drawing Sheets

CIRCUITS AND METHODS FOR DYNAMIC VOLTAGE MANAGEMENT

CROSS REFERENCE TO RELATED APPLICATIONS

This application is a non-provisional of and claims the benefit of priority from U.S. Patent Application No. 61/012,212, filed Dec. 7, 2007, entitled "On-Chip Dynamic Voltage Management Scheme for Minimizing Leakage" the disclosure of which is hereby incorporated herein by reference.

BACKGROUND

The present invention relates to voltage management, and in particular, to circuits and methods for dynamic voltage management.

Portable applications such as Personal Digital Assistants (PDAs), cell phones, and portable media players (PMPs) often operate from battery power. These applications try to conserve power when possible to increase the time between re-charging of the battery. Many portable devices implement standby and sleep modes to conserve power when the devices are not actively being used. For example, a cellular phone may switch into a standby mode when the user has not opened the phone to make a call for more than a minute. In standby mode, the cellular phone may turn off or disable all unnecessary electronics such that only a standby circuit is active. This limited operating condition may reduce power consumption and therefore may extend the time between re-charging of the battery.

Electronic devices may also utilize a sleep mode. The sleep mode may disable all unnecessary electronics as well. Sleep mode for these devices may utilize a small portion of current to power a circuit for sensing a button being depressed. This limited operating condition may also reduce power consumption and therefore extend the time between re-charging of the battery.

Although these power saving modes save power, the demand for more functionality is increasing the power demands on portable devices. For example, portable media players ("PMPs") integrate the functions of a cellular phone, PDA, web browser, media player, and a global positioning system (GPS) into one handheld device. All these functions may increase the amount of power used and may decrease the amount of time between re-charging of the battery. This may be troublesome if re-charging is required every day or twice a day.

SUMMARY

In one embodiment, the present invention includes a circuit comprising a voltage adjust circuit coupled to receive an input voltage, and an input terminal of an electronic system coupled to receive a supply voltage from an output terminal of the voltage adjust circuit, wherein the voltage adjust circuit adjusts the supply voltage based on a minimum voltage requirement of the electronic system during a power saving mode of operation, and in accordance therewith, reduces a leakage current supplied to the electronic system.

In one embodiment, upon entering a power saving mode of operation from an normal mode of operation, the supply voltage is adjusted from a voltage for normal operation to a minimum voltage to retain the state of the logic gates in the electronic system.

In one embodiment, the input voltage is generated by a battery.

In one embodiment, the voltage adjust circuit includes a voltage drop circuit and a switch configured in parallel between the input voltage and the output terminal of the voltage adjust circuit.

In one embodiment, the voltage adjust circuit includes a detector circuit having an input coupled to sense the input voltage and an output coupled to provide a signal to control the adjustment of the supply voltage.

In one embodiment, the voltage adjust circuit includes a detector circuit having an input coupled to sense the supply voltage and an output coupled to provide a signal to control the adjustment of the supply voltage.

In one embodiment, the voltage adjust circuit includes a voltage drop circuit coupled in series with a regulator.

In one embodiment, the voltage drop circuit includes a first circuit coupled in parallel with a switch.

In one embodiment, the first circuit is a diode.

In one embodiment, the regulator is a DC to DC converter.

In one embodiment, the adjustment includes changing the supply voltage by at least one discrete voltage step.

In one embodiment, the adjustment occurs when the supply voltage falls below a threshold.

In one embodiment, the adjustment occurs when the input voltage drops below a threshold.

In one embodiment, the voltage adjust circuit comprises a voltage drop circuit having a first terminal coupled to receive the input voltage, a switch having a first terminal coupled to receive the input voltage, a comparator having a first terminal coupled to the input voltage, a second terminal coupled to a reference voltage, and an output coupled to the control the switch, and a DC to DC converter coupled to an output terminal of the voltage drop circuit and an output terminal of the switch, wherein the comparator generates a first signal when the input voltage is above the reference voltage, and in accordance therewith, the switch is opened and the voltage drop circuit provides a voltage drop, and wherein the comparator generates a second signal when the input voltage is below the reference voltage, and in accordance therewith, the switch is closed and the input voltage is coupled to the input of the DC to DC converter.

In another embodiment, the present invention includes a method comprising converting an input voltage into a supply voltage using a voltage adjust circuit, powering an electronic system with the supply voltage, and adjusting the supply voltage generated by the voltage adjust circuit based on a minimum voltage requirement during a power saving mode of operation, and in accordance therewith, reducing the leakage current supplied to the electronic system.

In one embodiment of the method, upon entering a power saving mode of operation from a normal mode of operation, the supply voltage is adjusted from a voltage for normal operation to a minimum voltage to retain the state of the logic gates in the electronic system.

In one embodiment of the method, if the input voltage is above a threshold corresponding to said minimum voltage, said converting includes configuring the voltage adjust circuit to include a first voltage drop between the input voltage and the supply voltage, and if the input voltage is below the threshold, said converting includes configuring the voltage adjust circuit to short the input voltage to the supply voltage through a switch.

In one embodiment the method further comprises detecting the input voltage, and in accordance therewith, providing a signal to control the adjustment of the supply voltage based on the input voltage.

In one embodiment the method further comprises detecting the supply voltage, and in accordance therewith, providing a signal to control the adjustment of the supply voltage based on the supply voltage.

In one embodiment, converting comprises coupling the input voltage through a voltage drop circuit in series with a regulator.

In another embodiment, converting comprises configuring the voltage adjust circuit to include a first voltage drop between the input voltage and the input of the electronic system if the input voltage is above a threshold corresponding to said minimum voltage, and configuring the voltage adjust circuit to short an input and output of the voltage drop circuit through a switch if the input voltage is below the threshold.

In another embodiment, the voltage drop circuit selectively introduces a diode voltage drop between the input voltage and the electronic system.

In another embodiment, the regulator is a DC to DC buck converter.

In another embodiment, the adjustment includes changing the supply voltage by at least one discrete voltage step.

In another embodiment, the adjustment occurs when the supply voltage falls below a threshold.

In another embodiment, the adjustment occurs when the input voltage drops below a threshold.

In one embodiment of the method the converting comprises receiving a signal indicating that the electronic system has entered a power saving mode of operation, comparing the input voltage to a threshold corresponding to said minimum voltage requirement during a power saving mode of operation, coupling the input voltage through a voltage drop circuit if the input voltage is above said threshold, and coupling the input voltage through a switch if the input voltage is below said threshold, and coupling an output of the voltage drop circuit through a DC to DC converter.

In one embodiment, the input voltage is a battery voltage that reduces over time.

In one embodiment, the voltage drop circuit is a diode.

The following detailed description and accompanying drawings provide a better understanding of the nature and advantages of the present invention.

DETAILED DESCRIPTION

Described herein are techniques for voltage management. In the following description, for purposes of explanation, numerous examples and specific details are set forth in order to provide a thorough understanding of the present invention. The present invention as defined by the claims, however, may include some or all of the features in these examples alone or in combination with other features described below, and may further include modifications and equivalents of the features and concepts described herein.

Figure 1:
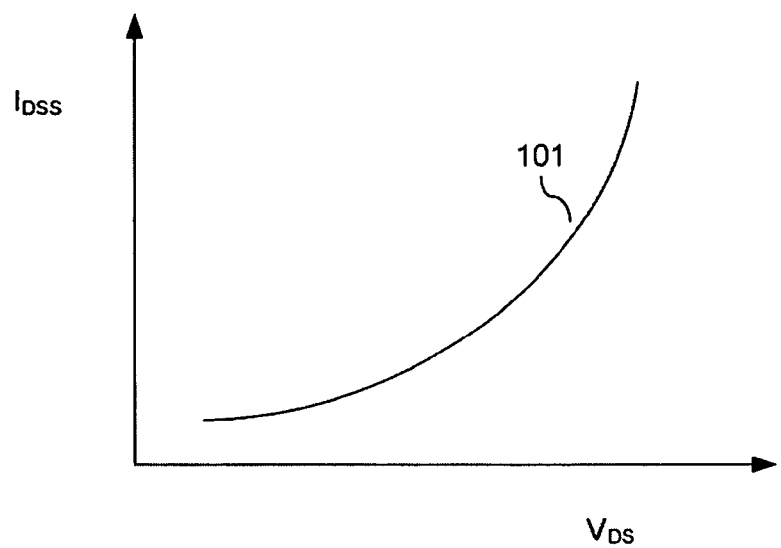
FIG. 1 illustrates a graph showing the relationship of leakage current $I_{DSS}$ to voltage $V_{DS}$ for a metal oxide semiconductor (MOS) transistor.

FIG. 1 illustrates a graph 100 showing the relationship of leakage current $I_{DSS}$ to voltage $V_{DS}$ for a metal oxide semiconductor (MOS) transistor. Curve 101 shows that as the voltage $V_{DS}$ increases, the leakage current $I_{DSS}$ increases exponentially. Many electronic devices utilize integrated circuits which may use hundreds or thousands of MOS devices. These MOS devices may not be operating, but may still be drawing current due to leakage.

At times, this leakage current may become a significant portion of power utilized. For example, during the time an electronic device is in a power saving mode (e.g. sleep or standby mode) the leakage of the MOS transistors may be as much as 50% of the total current dissipated for the device. Many portable devices remain in a power saving mode for most of the time the portable devices are powered. For example, a cellular phone may remain "on" for most of the day and only be utilized in a normal (or active) mode of operation once for a few minutes to make a single call. Improvement in the power consumption during the power saving modes may decrease energy use for the device, and in the case of portable applications, this may allow for extended use of the portable device between re-charges of the battery.

Reducing the input voltage to an electronic system may reduce the current consumption. For example, a system supplied by 1.2V and 300 μA in standby mode may benefit from a reduction in voltage to 1.0V. At 1.2V the total standby current may be 300 μA (Standby current total)=240 μA (leakage current)+60 μA (standby circuit current).

If the voltage is reduced to 1.0V the leakage current may be reduced by approximately half. Therefore, at 1.0V the total standby current may be 180 μA (Standby current total)=120 μA (leakage current)+60 μA (standby circuit current).

This results in reducing the standby current total by nearly half. If the system utilizes a battery which may supply 2 mA for 300 hours, then a savings of 100 μA may save 10 hours of standby time.

Figure 2:
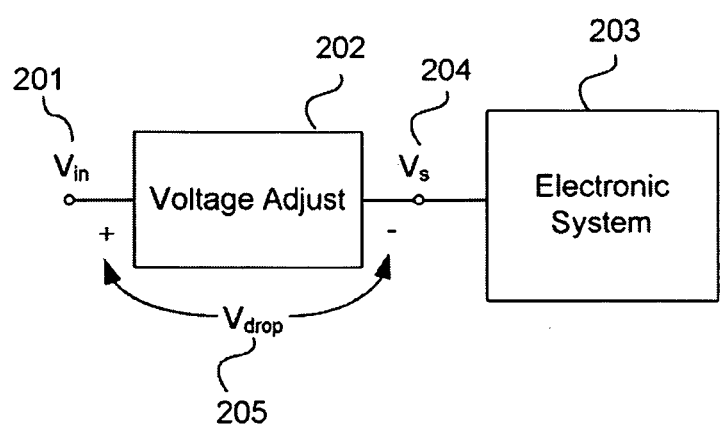
FIG. 2 illustrates dynamic voltage management for reducing power consumption according to one embodiment of the present invention.

FIG. 2 illustrates a dynamic voltage management circuit 200 for reducing power consumption according to one embodiment of the present invention. Circuit 200 may be part of a portable device such as a PDA, PMP, or a cellular phone, for example. Circuit 200 includes a voltage adjust circuit 202 and electronic system 203. A battery or other source of power may be used to provide an input voltage $V_{in}$ 201 to voltage adjust circuit 202. $V_{in}$ 201 and voltage adjust circuit 202 are used to provide power to electronic system 203. The input terminal of electronic system 203 is coupled to receive a supply voltage (Vs 204) from voltage adjust circuit 202.

Voltage adjust circuit 202 may dynamically make an adjustment to the supply voltage (Vs 204) based on a voltage requirement of electronic system. For example, electronic system 203 may include MOS transistors which may be drawing static leakage current from $V_{in}$ 201. In one implementation, voltage adjust circuit 202 adjusts a voltage drop $V_{drop}$ 205 so that the leakage current is decreased. The adjustment of $V_{drop}$ 205 may decrease Vs 204 to a level at which the leakage is reduced and some standby circuitry remains activated. The voltage requirement in this embodiment may be the minimal voltage required to retain the logic state of gates of the electronic circuit.

In one embodiment, a battery may supply $V_{in}$ 201. The battery (not shown) may be depleted over time. As $V_{in}$ 201 reduces, voltage adjust circuit 202 may need to change the adjustment of the voltage drop 205. The voltage drop 205 may be adjusted so that Vs 204 may power a standby circuit so that the leakage current is reduced. If the voltage $V_{in}$ 201 increases due to charging or any other circumstance, voltage adjust circuit 202 may increase the voltage drop 205 to optimize a power saving mode by reducing leakage current.

Figure 3:
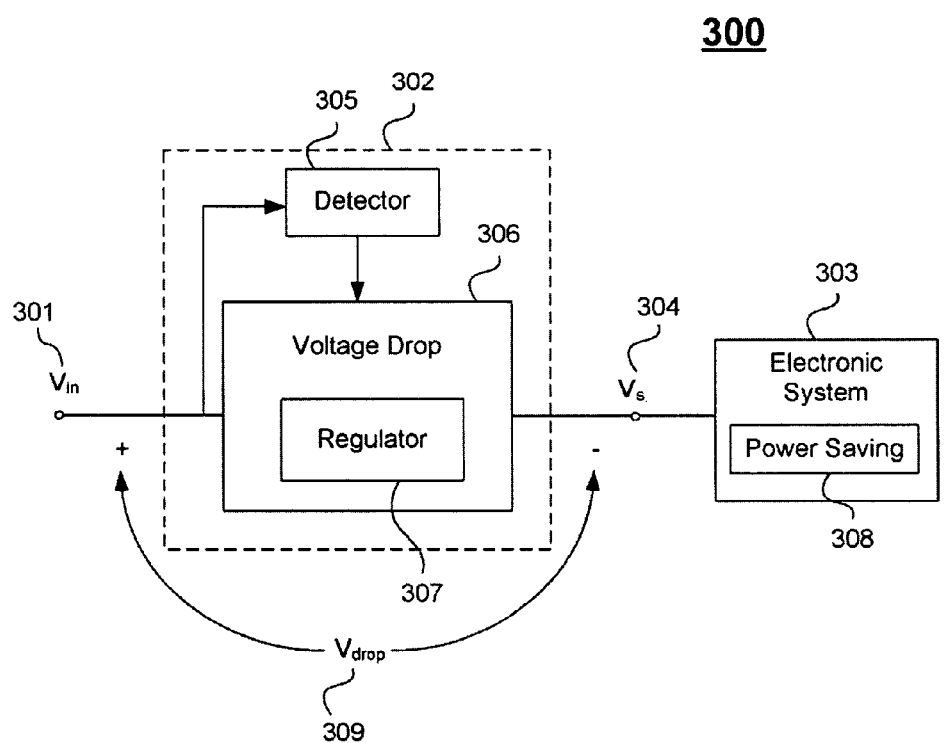
FIG. 3 illustrates dynamic voltage management for reducing power consumption according to another embodiment of the present invention.

FIG. 3 illustrates a dynamic voltage management circuit 300 for reducing power consumption according to one embodiment of the present invention. Circuit 300 may be part of a portable device such as a PDA, PMP, or a cellular phone, for example. Circuit 300 includes voltage adjust circuit 302 and electronic system 303. Voltage adjust circuit 302 includes detector 305 and voltage drop circuit 306. Voltage drop circuit 306 may include a regulator 307—e.g., a switching DC (direct current) to DC (direct current) converter.

Electronic system 303 provides the functionality for circuit 300. When active, the electronic system 303 may draw current to process information and display information, for example. Electronic system 303 may include power saving circuitry 308 which may remain operational during a power saving mode of the electronic system 303. In the power saving mode, other circuitry of electronic system 303 may be inactive and may draw only leakage current. This leakage current may correspond to the supply voltage Vs 304. The power saving circuitry 308 may have a voltage requirement in the power saving mode which is lower than the required voltage to operate the other circuitry in the active (e.g., normal) mode. The power saving mode of the electronic system 303 may be used to change Vs to conserve energy.

Detector 305 provides a signal to control the adjustment of the supply voltage. For example, detector 305 may sense a reference voltage $V_{in}$ 301. This signal may indicate that the voltage $V_{in}$ 301 is above a threshold. This threshold may represent a minimum voltage requirement to operate the electronic system in power saving mode. If the $V_s$ 304 is sufficiently high, this threshold may indicate that that a voltage drop $V_{drop}$ 309 may be available to reduce the supply voltage $V_s$ 304 in order to reduce the leakage current. This signal may be coupled to voltage drop circuit 306 so that a voltage drop may be added to reduce the voltage $V_s$ 304.

Voltage drop circuit 306 may include regulator 307. Regulator 307 may provide a portion of the voltage drop. For example, a first circuit may provide a first voltage drop, and the regulator 307 may provide a second voltage drop. The voltage drop provided by the regulator 307 may depend on the voltage provided to the input terminal of the regulator 307. $V_{drop}$ 309 may include the voltage drop provided by the regulator 307 and another circuit selectively placed in series between $V_{in}$ 301 and $V_s$ 304. For example, in one embodiment described in more detail below, a circuit having a first voltage drop is configured in parallel with a switch having no voltage drop. When the input reference voltage (e.g., a battery voltage) is above a threshold the switch is opened and the voltage drop is introduced to lower Vs, and when the input reference voltage is below the threshold, the switch is closed and the voltage drop is removed.

Figure 4:
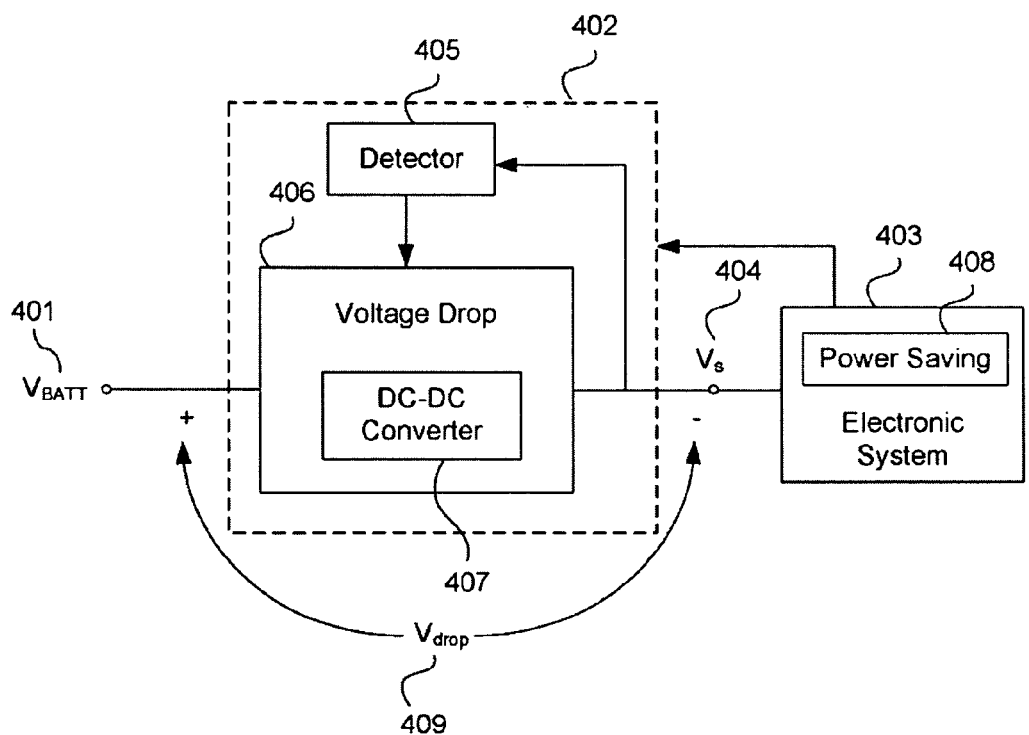
FIG. 4 illustrates dynamic voltage management for reducing power consumption according to yet another embodiment of the present invention.

FIG. 4 illustrates a dynamic voltage management circuit 400 for reducing power consumption according to one embodiment of the present invention. Circuit 400 may be part of a portable device such as a PDA, PMP, or a cellular phone, for example. Circuit 400 includes voltage adjust circuit 402 and electronic system 403. Voltage adjust circuit 402 includes detector 405 and voltage drop circuit 406. Voltage drop circuit 406 may include DC-to-DC converter 407.

Circuit 400 is similar to circuit 300 of FIG. 3. In this embodiment, the detector 405 is coupled to receive the supply voltage $V_s$ 404. In this embodiment, detector 405 may sense $V_s$ 404 directly at the input terminal of the electronic system 403. This may allow for the adjustment of the voltage $V_s$ 404 to be accurately controlled. The adjustment of the voltage $V_s$ 404 may include control of voltage drop $V_{drop}$ 409.

Electronic system 403 may include power saving circuitry 408. When circuit 400 is idle for a particular duration, the electronic system 403 may enter a power saving mode. Electronic system 403 may also signal the voltage adjust circuit 402 that the electronic system 403 has entered a power saving mode.

The power saving mode may result in a mode to conserve energy. For example, the power saving circuitry may be the only active circuitry of electronic system 403. This may conserve energy be reducing the number of gates (not shown) switching within the electronic system 403. The voltage adjustment circuit 402 may respond to the changing of the mode to power saving mode.

Once electronic system 403 goes into power saving mode, a signal from electronic system 403 may be transmitted to the voltage adjust circuit 402 to change the threshold such that voltage drop circuit 406 adds a voltage drop and $V_s$ 404 is adjusted down. The lowering voltage $V_s$ 404 may decrease the leakage current for electronic system 403.

In one embodiment, voltage drop circuit 406 includes DC to DC converter 407. Voltage drop $V_{drop}$ 409 may include a voltage drop provided between an input and output terminal of DC to DC converter 407. $V_{drop}$ 409 may be adjusted depending on the mode of the electronic system. For example, if the electronic system 403 goes into a power saving mode, the electronic system may signal DC to DC converter 407 to provide a voltage drop corresponding to the voltage requirement of electronic system in power saving mode.

Figure 5A:
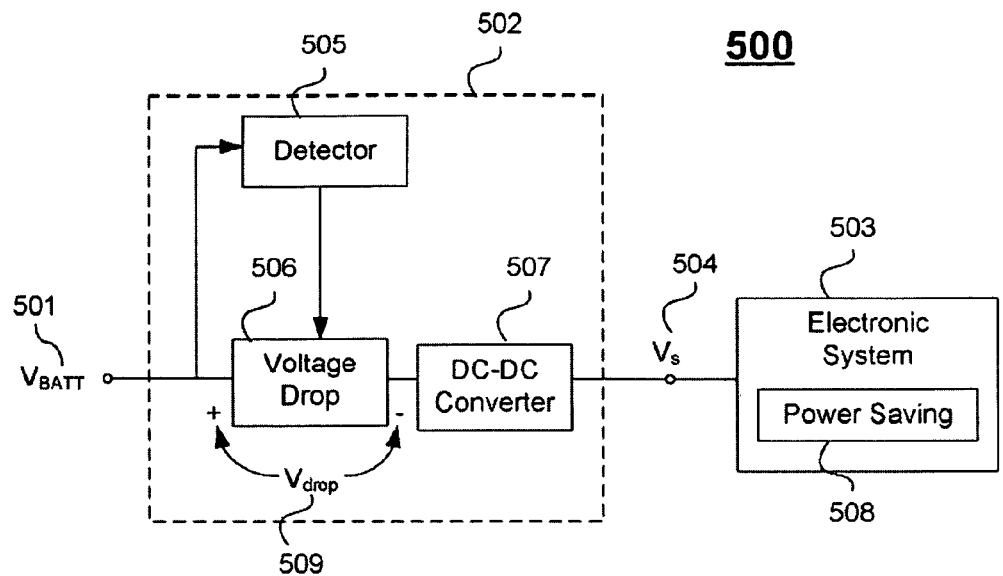
FIG. 5A illustrates dynamic voltage management for reducing power consumption according to one embodiment of the present invention.

FIG. 5A illustrates a dynamic voltage management circuit 500 for reducing power consumption according to one embodiment of the present invention. Circuit 500 includes voltage adjust circuit 502 and electronic system 503. Voltage adjust circuit 502 includes detector 505, voltage drop circuit 506, and DC to DC converter 507.

Circuit 500 is similar to circuit 300 of FIG. 3. In this embodiment, the DC to DC converter 507 and the voltage drop circuit 506 are configured in series. Detector 505 senses a reference voltage and adjusts the supply voltage $V_s$ 504 by adjusting the voltage drop circuit 506, and coupling the adjusted voltage through DC to DC converter 507. DC to DC converter 507 may also reduce $V_s$ 504. For example, circuit 500 can utilize a battery to supply $V_{BATT}$ 501. The battery may supply $V_{BATT}$ 501 in the range of 2.2V-3.8V with a nominal value of 3V. Voltage adjust circuit 502 may supply a nominal voltage $V_s$ 504 of about 1V utilizing DC to DC converter 507. In this example, detector 505 may sense if $V_{BATT}$ 501 exceeds a threshold of 3V. When this occurs, the detector 505 may produce a signal (e.g., a logic 0) to voltage drop circuit 506 to add voltage drop $V_{drop}$ 509 when the circuit 500 is in a power saving mode. As described below, voltage drop circuit 506 may insert a circuit (e.g., one or more electronic elements or devices) between Vbatt and Vs to produce the voltage drop $V_{drop}$ 509 required, for example. If the battery decays and $V_{BATT}$ 501 drops below 3V, detector 505 may signal voltage drop circuit 506 to remove the voltage drop. The voltage drop is removed and added based on the minimum voltage requirement of the electronic system 503.

The voltage adjust circuit 502 dynamically adjusts the supply voltage $V_s$ 504 by providing a voltage drop $V_{drop}$ 509. For example, for a DC to DC converter with a 3:1 input-tooutput voltage ratio, $V_{drop}$ 509 may cause the voltage $V_{BATT}$ 501 to drop from a nominal 3V to 2.4V, thereby lowering $V_s$ 504 from approximately 1V to 0.8V. The approximation in DC to DC converter 507 output is caused by a finite output ripple due to the operation of the DC to DC converter 507. The lowering of $V_s$ 504 may reduce the leakage, and maintain state-retentive logic.

Electronic system 503 may utilize power saving circuitry 508. Power saving circuitry 508 may keep alive circuitry which may wake up electronic system 503 when a user input is sensed. Other circuitry of electronic system 503 may contain logic which may be inactive or asleep but may require a minimum voltage in order to retain a state of the logic. This voltage may define a voltage requirement of electronic system 503.

Figure 5B:
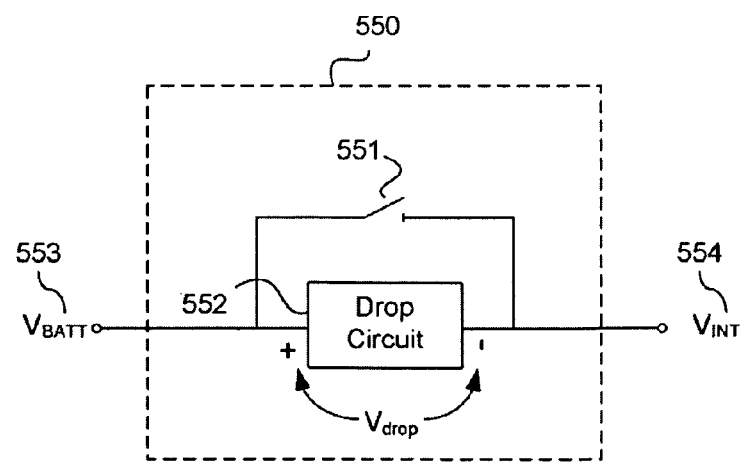
FIG. 5B illustrates a voltage drop circuit according to one embodiment of the present invention.

FIG. 5B illustrates a voltage drop circuit 550 according to one embodiment of the present invention. Voltage drop circuit 550 includes a drop circuit 552 in parallel with a switch 551. Voltage drop circuit 550 may include one or more elements such as a diode, a transistor, a resistor, or any combination thereof, for example, configured to generate a voltage drop between an input terminal and output terminal. Switch 551 may be a MOS switch integrated along with voltage drop circuit 552. Switch 551 allows for a voltage drop to be added when switch 551 is open (as shown).

Figure 6:
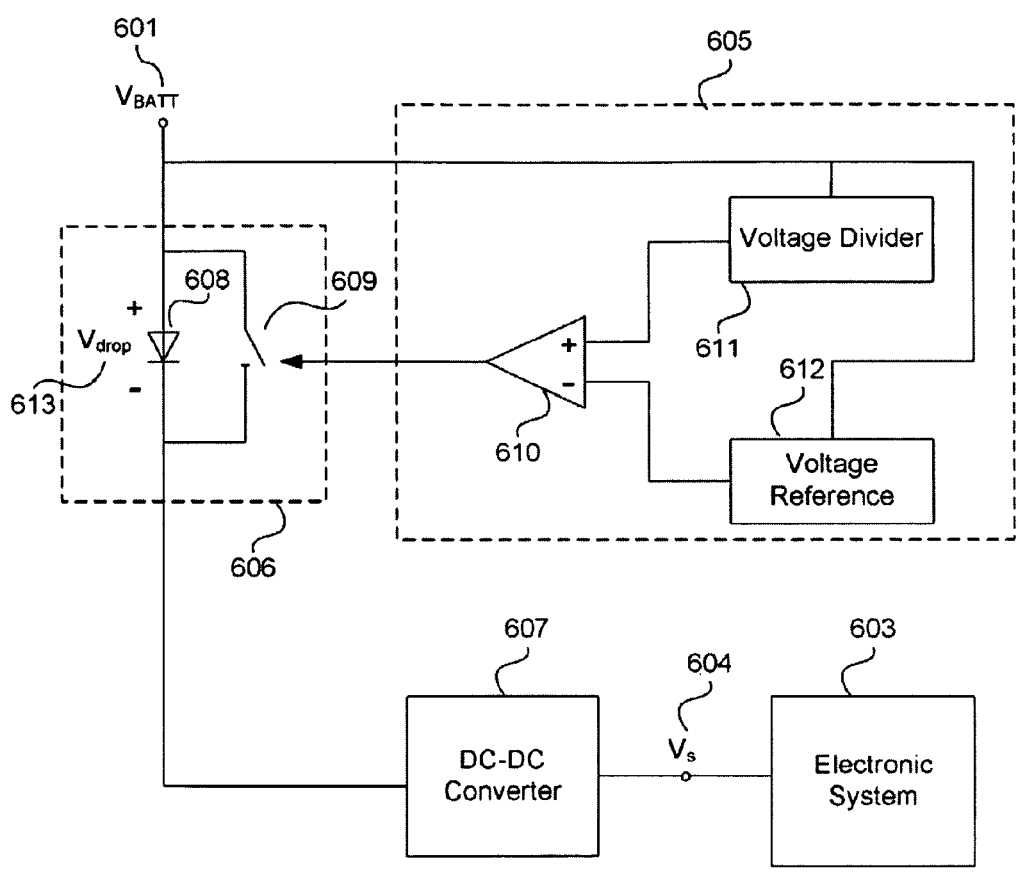
FIG. 6 illustrates dynamic voltage management for reducing power consumption according to another embodiment of the present invention.

FIG. 6 illustrates a dynamic voltage management circuit 600 for reducing power consumption according to one embodiment of the present invention. Circuit 600 includes voltage drop circuit 606, detector 605, DC to DC buck converter 607, and electronic system 603. Circuit 600 may be powered by a battery that provides a voltage $V_{BATT}$ 601 to voltage drop circuit 606 and detector 605. Voltage drop circuit 606 is coupled to the input terminal of DC to DC converter 607. DC to DC converter 607 has an output terminal coupled to provide power to electronic system 603.

Circuit 600 is similar to circuit 500 of FIG. 5. In this embodiment voltage drop circuit 606 includes diode 608 coupled in parallel with switch 609. Switch 609 adds a voltage drop by opening and requiring current to flow through diode 608. This adds a nominal 0.6V voltage drop. Switch 609 removes the voltage drop by closing and therefore shorting out the 0.6V and allowing current to flow through switch 609.

In this embodiment, detector 605 includes comparator 610, voltage divider 611, and voltage reference 612. Voltage divider 611 may comprise MOSFETs (metal oxide semiconductor field effect transistors). Voltage reference 612 may be a bandgap reference. $V_{BATT}$ 601 is scaled by voltage divider 611 and compared by comparator 610 to a reference voltage provided by voltage reference 612. The scaling and the value of the reference voltage provided by voltage reference 612 may establish a threshold at which switch 609 is switched. As mentioned above, the threshold may be a minimum operating voltage required during power saving mode.

Circuit 600 utilizes switch 609 and diode 608 to provide an adjustable voltage drop $V_{drop}$ 613 which may reduce the voltage provided to electronic system 603. For example, circuit 600 may utilize a battery to supply $V_{BATT}$ 601. The battery may supply $V_{BATT}$ 601 in the range of 2.2V-3.8V with a nominal value of 3V. DC to DC converter 607 may supply a nominal voltage $V_s$ 604 of about 1V utilizing DC to DC converter 607. In this example, detector 605 may use voltage divider 611 to generate a voltage from $V_{BATT}$ 601. This voltage may be compared to a reference voltage generated form voltage reference 612. For example, voltage reference 612 may establish a threshold voltage of 3V. If $V_{BATT}$ 601 exceeds 3V, the comparator may produce a signal (e.g., a logic 0) to open switch 609 and establish a voltage drop $V_{drop}$=0.6V. If the battery decays and $V_{BATT}$ 601 drops below 3V, comparator 610 may produce a signal to close switch 609 and remove the voltage drop $V_{drop}$ 613. The 0.6V voltage drop (i.e., $V_{drop}$) is removed and added based on the minimum voltage requirement of the electronic system 603.

$V_{drop}$ 613 may cause the voltage $V_{BATT}$ 601 to drop from a nominal 3V to 2.4V thereby lowering $V_s$ 604 from approximately 1V to 0.8V. The lowering of $V_s$ 604 may reduce the leakage, and maintain a state-retentive logic.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. A voltage adjustment circuit for reducing a leakage current between a drain terminal and a source terminal of a metal oxide semiconductor (MOS) transistor in an electric system during a power save mode, the voltage adjustment circuit comprising:

an input terminal and an output terminal, wherein the input terminal is configured to receive an input reference voltage to be potentially supplied to the electric system during the power save mode;

a detector coupled to the input terminal, wherein the detector is configured to (i) monitor the input reference voltage at the input terminal, and (ii) generate a voltage drop to reduce the input reference voltage in response to the input reference voltage exceeding a first threshold;

a voltage drop circuit configured to
 (i) in response to the input reference voltage exceeding the first threshold, reduce the input reference voltage based on the voltage drop and pass the reduced input reference voltage to the output terminal, wherein the reduced input reference voltage is supplied from the output terminal to the electronic system, and
 (ii) in response to the input reference voltage not exceeding the first threshold, pass the input reference voltage, unchanged, to the output terminal, wherein the unchanged input reference voltage is supplied from the output terminal to the electronic system;

a switch having a first terminal coupled to receive the input reference voltage;

a comparator having a first terminal coupled to the input reference voltage, a second terminal coupled to a threshold voltage that is representative of the first threshold, and an output coupled to the switch; and a DC to DC converter coupled to the output terminal of the voltage adjustment circuit and coupled to an output terminal of the switch, wherein the comparator generates a first signal when the input reference voltage exceeds the threshold voltage, and in accordance therewith, the switch is opened and the voltage drop circuit reduces the input reference voltage, and wherein the comparator generates a second signal when the input reference voltage does not exceed the threshold voltage, and in accordance therewith, the switch is closed and the input reference voltage is coupled to an input of the DC to DC converter.

2. The voltage adjustment circuit of claim 1, wherein upon entering the power save mode from a normal mode of operation, the input reference voltage is adjusted from a voltage for normal operation to a minimum voltage to retain a state of logic gates in the electronic system.

3. The voltage adjustment circuit of claim 1, wherein the detector is configured to provide a signal to the voltage drop circuit, and wherein the signal indicates whether the input reference voltage exceeds the first threshold.

4. The voltage adjustment circuit of claim 1, wherein the detector is configured to monitor a voltage at the output terminal and to provide a signal to the voltage drop circuit to control the input reference voltage, wherein the signal is based on the voltage at the output terminal.

5. The voltage adjustment circuit of claim 1, wherein the voltage drop circuit is coupled in series with a regulator.

6. The voltage adjustment circuit of claim 5, wherein the voltage drop circuit is connected in parallel with a switch, and wherein the switch is configured to enable or disable the voltage drop circuit based on a signal from the detector.

7. The voltage adjustment circuit of claim 1, wherein the voltage drop circuit is enabled when the input reference voltage exceeds the first threshold, and wherein the voltage drop circuit is disabled when the input reference voltage does not exceed the first threshold.

8. The voltage adjustment circuit of claim 1, wherein:
the detector is configured to (i) receive a sleep signal from the electronic system, and (ii) enable the voltage drop circuit based on the sleep signal received from the electronic system.

9. The voltage adjustment circuit of claim 1, wherein:
the voltage drop circuit reduces the input reference voltage by at least one discrete voltage step in response to the input reference voltage exceeding the first threshold.

10. A method for reducing a leakage current between a drain terminal and a source terminal of a metal oxide semiconductor (MOS) transistor in an electronic system during a power save mode, the method comprising:
receiving an input reference voltage to be potentially supplied to the electronic system during the power save mode, the input reference voltage being received at an input terminal;
monitoring the input reference voltage at the input terminal;
generating a voltage drop to reduce the input reference voltage in response to the input reference voltage exceeding a first threshold;
in response to the input reference voltage exceeding the first threshold, reducing the input reference voltage based on the voltage drop and passing the reduced input reference voltage to an output terminal, wherein the reduced input voltage is supplied from the output terminal to the electronic system; and
in response to the input reference voltage not exceeding the first threshold, passing the input reference voltage, unchanged, to the output terminal, wherein the unchanged input reference voltage is supplied from the output terminal to the electronic system;
monitoring voltages at a voltage adjustment circuit that includes the input terminal and the output terminal, the voltage adjustment circuit further including:
a switch having a first terminal coupled to receive the input reference voltage;
a comparator having a first terminal coupled to the input reference voltage, a second terminal coupled to a threshold voltage that is representative of the first threshold, and an output coupled to the switch; and
a DC to DC converter coupled to the output terminal of the voltage adjustment circuit and coupled to an output terminal of the switch, wherein the comparator generates a first signal when the input reference voltage exceeds the threshold voltage, and in accordance therewith, the switch is opened and the input reference voltage is reduced, and wherein the comparator generates a second signal when the input reference voltage does not exceed the threshold voltage, and in accordance therewith, the switch is closed and the input reference voltage is coupled to an input of the DC to DC converter.

11. The method of claim 10, further comprising:
upon entering the power save mode from a normal mode of operation, adjusting the input reference voltage from a voltage for normal operation to a minimum voltage to retain a state of logic gates in the electronic system.

12. The method of claim 10, further comprising:
generating a signal, wherein the signal indicates whether the input reference voltage exceeds the first threshold.

13. The method of claim 10, further comprising:
monitoring a voltage at the output terminal; and
generating a signal to control the input reference voltage, wherein the signal is based on the voltage at the output terminal.

14. The method of claim 10, wherein the input reference voltage is reduced by a voltage drop circuit, and wherein the voltage drop circuit is coupled in series with a regulator.

15. The method of claim 14, wherein the voltage drop circuit is connected in parallel with a switch, wherein the switch is configured to enable or disable the voltage drop circuit based on whether the input reference voltage exceeds the first threshold.

16. The method of claim 10, wherein the input reference voltage is reduced by a voltage drop circuit, the method further comprising:
enabling the voltage drop circuit when the input reference voltage exceeds the first threshold; and
disabling the voltage drop circuit when the input reference voltage does not exceed the first threshold.

17. The method of claim 10, further comprising:
receiving a sleep signal from the electronic system, wherein the input reference voltage is reduced based on the sleep signal.

18. The method of claim 10, wherein the input reference voltage is reduced by at least one discrete voltage step.

19. The voltage adjustment circuit of claim 1, wherein the voltage drop is calculated to reduce the leakage current between the drain terminal and the source terminal of the metal oxide semiconductor (MOS) transistor of the electronic system during the power save mode.

20. The method of claim 10, wherein the voltage drop is calculated to reduce the leakage current between the drain terminal and the source terminal of the metal oxide semiconductor (MOS) transistor of the electronic system during the power save mode.

* * * * *